United States Patent
Lin et al.

(10) Patent No.: US 11,882,637 B2
(45) Date of Patent: Jan. 23, 2024

(54) OPERATION METHOD OF PROXIMITY SENSOR

(71) Applicant: SENSORTEK TECHNOLOGY CORP., Zhubei (TW)

(72) Inventors: Meng-Yong Lin, Zhubei (TW); Ming-Huang Liu, Zhubei (TW); Jer-Hau Hsu, Zhubei (TW); Cheng-Feng Liu, Zhubei (TW)

(73) Assignee: Sensortek Technology Corp., Zhubei (TW)

( * ) Notice: Subject to any disclaimer, the term of this patent is extended or adjusted under 35 U.S.C. 154(b) by 0 days.

(21) Appl. No.: 17/587,035

(22) Filed: Jan. 28, 2022

(65) Prior Publication Data
US 2022/0312570 A1   Sep. 29, 2022

Related U.S. Application Data

(60) Provisional application No. 63/142,558, filed on Jan. 28, 2021.

(51) Int. Cl.
*H05B 47/11* (2020.01)
*H05B 47/17* (2020.01)
(Continued)

(52) U.S. Cl.
CPC ........... *H05B 47/11* (2020.01); *H05B 47/155* (2020.01); *H05B 47/165* (2020.01); *H05B 47/17* (2020.01)

(58) Field of Classification Search
CPC .... H05B 47/11; H05B 47/155; H05B 47/165; H05B 47/17; H03K 2217/941;
(Continued)

(56) References Cited

U.S. PATENT DOCUMENTS

| 2013/0147368 A1 | 6/2013 | McCavit et al. |
| 2017/0034888 A1 | 2/2017 | Verma |

(Continued)

FOREIGN PATENT DOCUMENTS

| CN | 101825462 A | 9/2010 |
| CN | 102650918 A | 8/2012 |

(Continued)

OTHER PUBLICATIONS

Office Actions issued to Chinese Counterpart Application No. 202210108020.5 dated Mar. 30, 2023.

(Continued)

*Primary Examiner* — Daniel D Chang
(74) *Attorney, Agent, or Firm* — Rosenberg, Klein & Lee

(57) ABSTRACT

An operation method of a proximity sensor comprises: controlling a light-emitting element by a processing circuit. Such control includes a plurality of light source on and light source off operations. An optical sensor receives light and outputs a sensing signal corresponding to the intensity of the light. The processing circuit computes the sensing signal to produce a sensing result. The plurality of light source on and light source off operations includes a group having two light sources on operations and two light sources off operations. The two light sources on operations in the group or the two light sources off operations in the group are performed consecutively. In this way, the ambient light components of the light source on and off operations may cancel out each other to reduce the ambient light components contained in the sensing results.

9 Claims, 7 Drawing Sheets

(51) Int. Cl.
*H05B 47/165* (2020.01)
*H05B 47/155* (2020.01)

(58) Field of Classification Search
CPC ........ H03K 2217/94116; H03K 17/945; G01S 7/484; G01S 7/487; G01S 17/04; H04M 1/72454; H04M 1/22; H04M 2250/12
See application file for complete search history.

(56) References Cited

U.S. PATENT DOCUMENTS

2020/0084860 A1* 3/2020 Lydecker ............... H05B 47/19
2022/0312570 A1* 9/2022 Lin ...................... H05B 47/165

FOREIGN PATENT DOCUMENTS

| | | |
|---|---|---|
| CN | 105721786 A | 6/2016 |
| CN | 107257415 A | 10/2017 |
| CN | 107465778 A | 12/2017 |
| CN | 110998366 A | 4/2020 |
| CN | 111947689 A | 11/2020 |
| JP | 2015002502 A | 1/2015 |
| TW | 201919354 A | 5/2019 |

OTHER PUBLICATIONS

First Office Action mailed to Taiwanese counterpart Patent application No. 111104174 dated Jun. 2, 2023.
Search Report mailed to Taiwanese counterpart Patent Application No. 111104174 dated Jun. 2, 2023.

* cited by examiner

OPERATION METHOD OF PROXIMITY SENSOR

FIELD OF THE INVENTION

The present application generally relates to a control method of a proximity sensor, and particularly to an operation method of the proximity sensor.

BACKGROUND OF THE INVENTION

Proximity sensors are widely applied to portable electronic devices such as mobile phones or tablet computers that everyone owns. A regular application is that during a call, a smartphone will detect the distance between the user and the panel using a proximity sensor so that the control unit inside the smartphone may judge whether to turn off the touch or display functions of the panel according to the sensing result of the proximity sensor.

As shown in FIG. 1, in a proximity sensor 100 according to the prior art, a light-emitting unit 101 (for example, a light-emitting diode LED, a laser diode LD) generates light L. The light L is reflected by a reflector (for example, a human body or reflective objects) and generates corresponding reflection light. The reflection light is received by an optical sensor 103 (for example, a photodiode PD) and hence providing the sensing result for distance. Unfortunately, the sensing result of the optical sensor 103 includes the component of ambient light. To avoid the influence of ambient light on the sensing result, the optical sensor 103 may perform sensing under the light source is turned on and turned off, respectively. Then, the component of ambient light may be subtracted to reduce its influence. Nonetheless, as shown in FIG. 2, if the ambient light A comes from an AC light source such as a fluorescent lamp, the luminance of the ambient light A varies. If the sensing time interval between the light-source under turn-on ON state and the light-source under turn-off OFF state is too long, the difference between two sensed luminance values will be too large so that the component of the ambient light A may not be subtracted by the proximity sensor 100, and thus a larger sensing error is generated.

For example, if a period of a light-source turn-on operation p1 is 400 µs and a period of a light-source turn-off operation p2 immediately behind the light-source turn-on operation p1 is also 400 µs. When the luminance of the ambient light A is increased in a risen slope, the components of the ambient light A received during the light-source turn-off operation p2 will be higher than the component of the ambient light A received during the light-source turn-on operation p1. Thereby, after a processing circuit 107 integrates the sensing signal output by the optical sensor 103, the ambient-light component a in the integration over the light-source turn-on operation p1 will be smaller than the ambient-light component b in the integration over the light-source turn-off operation p2. Thereby, if the processing circuit 107 subtracts the integration over the light-source turn-off operation p2 from the integration over the light-source turn-on operation p1, the component of the ambient light A may not be subtracted completely and thus contribute a substantial noise signal in the sensing result.

To improve the prior art and solve the described problem, a general method is to shorten the sensing time interval between the light-source turn-on ON state and the light-source turn-off OFF state. In other words, the periods of the light-source turn-on operation p1 and the light-source turn-off operation p2 as described above are shortened. Likewise, as shown in FIG. 2, the light-source turn-on operation p1 and the light-source turn-off operation p2 are divided into N sets of light-source turn-on operations ON(1)~ON(N) and light-source turn-off operations OFF(1)~OFF(N). In addition, each light-source turn-on operation ON(i) is immediately followed by a light-source turn-off operation OFF(i). Then the period of each light-source turn-on operation ON or each light-source turn-off operation OFF is shortened, for example, from 400 µs to 12.5 µs.

Consequently, although the ambient-light component in the integration for each light-source turn-on operation ON(i) is still different from the ambient-light component in the integration for each light-source turn-off operation OFF(i), their differences decrease. For example, if the ambient-light component a in the integration for the light-source turn-on operation p1 is 1500 units and the ambient-light component b in the integration for the light-source turn-off operation p2 is 2200 units, after the processing circuit 107 subtracts the integration for the light-source turn-off operation p2 from the integration for the light-source turn-on operation p1, the remaining component of the ambient light A is a−b=−700 units. Similarly, when the ambient light A is decreased in falling slope, the remaining component of the ambient light A will be b−a=700 units. As to the noise up to ±700 units, by dividing the light-source turn-on operation p1 and the light-source turn-off operation p2 into N sets of light-source turn-on operations ON(i) and light-source turn-off operations OFF(i), after the processing circuit 107 subtracting the sum of the integrations for all light-source turn-off operations OFF(i) from the sum of the integration for all light-source turn-on operations ON(i), only ±200 units of noise will be generated.

Although the mentioned method for shortening the operation period of light-source turning on and turning off may reduce the remaining ambient-light component in the sensing result actually, the operation frequency of the circuit is limited by the operation speed of devices. It is not possible to increase the operation frequency unlimitedly for shortening the operation period of light-source turning on and turning off. Besides, considering the trend of full-screen display for various electronic devices, manufactures are forced to disposed the proximity sensors below the panel. Consequently, the intensity of the light received by the optical sensor 103 is reduced significantly. Where the integration for the reflection light operated by the processing circuit 107 might barely reach around 50 units. Given such a harsh condition, even the ambient-light component according to the prior art may be reduced to ±200 units, the accuracy of the proximity sensor 100 is still affected.

Accordingly, the present application provides an operation method of proximity sensor to further reduce errors in the ambient light values and solving the accuracy problem in proximity sensors.

SUMMARY

An objective of the present application is to provide an operation method effectively and easily applied for a proximity sensor. By adjusting the execution sequence of the light-source turn-on operation and the light-source turn-off operation for cancelling out the ambient-light components in light-source turning on and off and hence achieving the effect of reducing the ambient-light component in the sensing result.

According to an embodiment of the present application, an operation method of proximity sensor is disclosed, which comprises steps of: a processing circuit controlling a light-emitting device to emit light using a plurality sets of light-source turn-on operations and light-source turn-off operations; an optical sensor receiving light and outputting a sensing signal corresponding to the intensity of the received light; and a processing circuit operating the sensing signal to produce a sensing result. According to an improved embodiment of the present application, the light-source turn-on operations and the light-source turn-off operations include a group. The group includes two sets of light-source turn-on operations and light-source turn-off operations executed successively. The two times of light-source turn-on operations or the two times of light-source turn-off operations in the group are performed continuously.

DETAILED DESCRIPTION

In order to make the structure and characteristics as well as the effectiveness of the present application to be further understood and recognized, the detailed description of the present application is provided as follows along with embodiments and accompanying figures.

Figure 1:
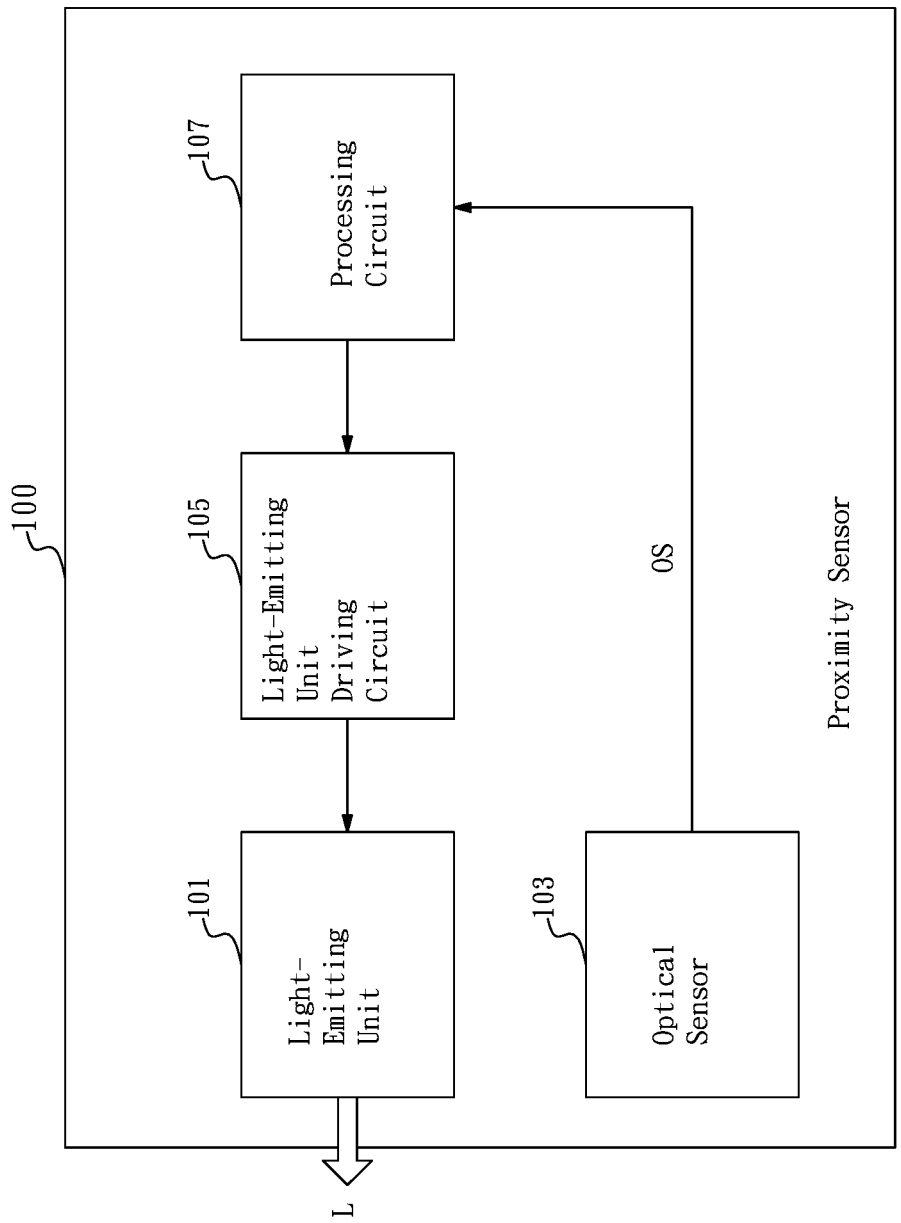
FIG. 1 shows a block diagram of the proximity sensor according to an embodiment of the present application.
Figure 3:
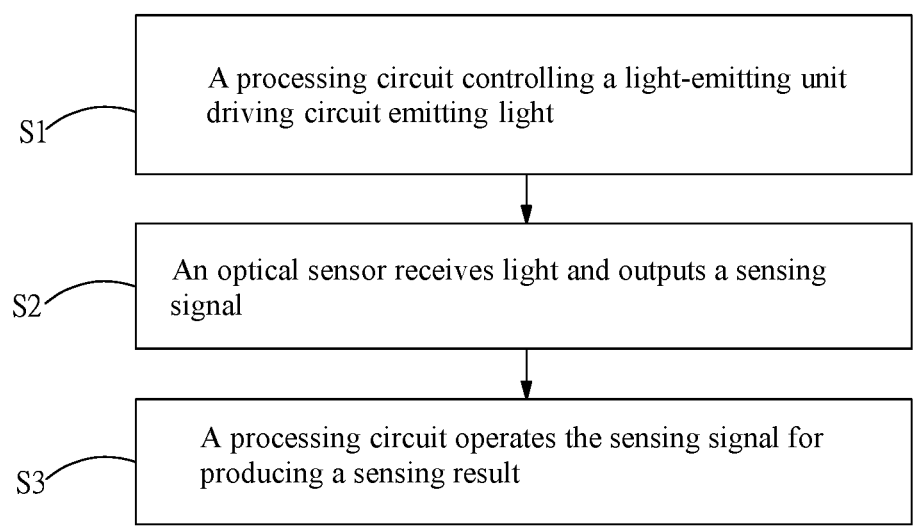
FIG. 3 shows a flowchart of the control method of proximity sensor according to an embodiment of the present application.

First, please refer to FIG. 3, which shows a flowchart of the control method of proximity sensor according to an embodiment of the present application. The control method of proximity sensor according to the present application may be applied to controlling the structure of the proximity sensor 100 as shown in FIG. 1.

The operation method of proximity sensor according to the present application comprises steps of:

A processing circuit 107 controls a light-emitting unit driving circuit 105 so that the light-emitting unit driving circuit 105 supplies a driving current to a light-emitting unit 101 and further the light-emitting unit 101 is driven by the driving current to emit light L. The emitted light L may be infrared light.

An optical sensor 103 receives light and outputs a sensing signal corresponding to the intensity of the light. The received light may include the ambient-light component as well as the reflection light formed by reflecting the light L from a reflector.

A processing circuit 107 operates the sensing signal OS output by the optical sensor 103 for producing a sensing result. The operations include integration operations and subtraction operations. The operations may integrate and summate the sensing signals generated under the light-source turn-on operations and light-source turn-off operations and subtract the integration for light-source turn-off operation from the integration for light-source turn-on operations to form the sensing result. The sensing result may be used to judge if a reflector is proximate to the proximity sensor 100.

Figure 4:
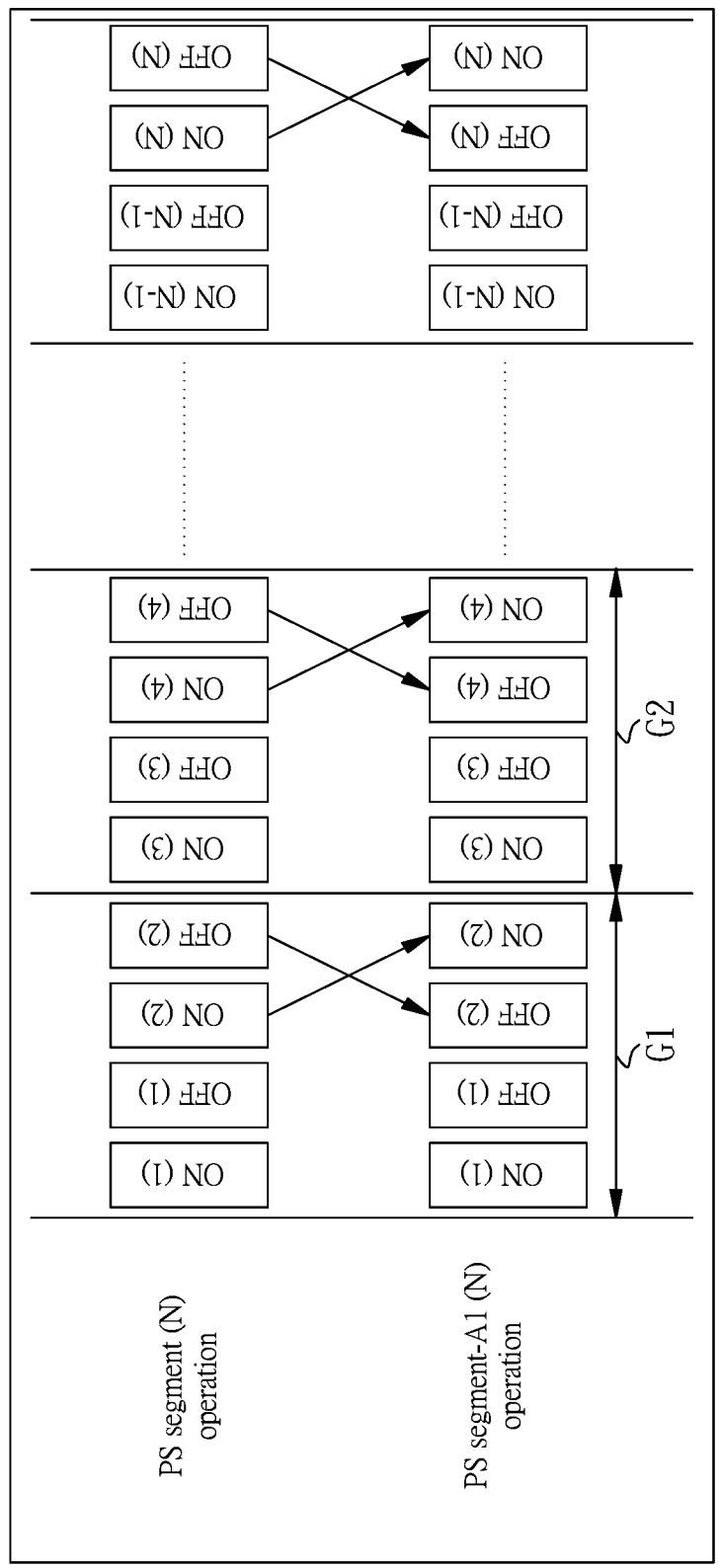
FIG. 4 shows a timing diagram of the turn-on/turn-off operations of the light source according to a first embodiment of the present application.

Please refer to FIG. 4, which shows the operation timing diagram of the processing circuit 107. The processing circuit 107 uses a plurality sets of light-source turn-on operations and light-source turn-off operations to control the light-emitting unit 101 emitting light. According to the present embodiment, N sets of light-source turn-on operations ON(1)~ON(N) and light-source turn-off operations OFF(1)~OFF(N) are used as an example The plurality sets of light-source turn-on operations and light-source turn-off operations include a group G1. The group G1 includes two sets of light-source turn-on operations ON(1), ON(2) and light-source turn-off operations OFF(1), OFF(2). The two light-source turn-on operations ON(1), ON(2) and the two light-source turn-off operations OFF(1), OFF(2) are performed successively.

To elaborate, the order according to the prior art is the first light-source turn-on operation ON(1), the first light-source turn-off operation OFF(1), the second light-source turn-on operation ON(2), and the second light-source turn-off operation OFF(2), as shown in the upper half of FIG. 4. According to the present embodiment, the order of the second light-source turn-on operation ON(2) and the second light-source turn-off operation OFF(2) is swapped. forming the order of the first light-source turn-on operation ON(1), the first light-source turn-off operation OFF(1), the second light-source turn-off operation OFF(2), and the second light-source turn-on operation ON(2). Thereby, the first light-source turn-off operation OFF(1) and the second light-source turn-off operation OFF(2) are performed successively.

Figure 2:
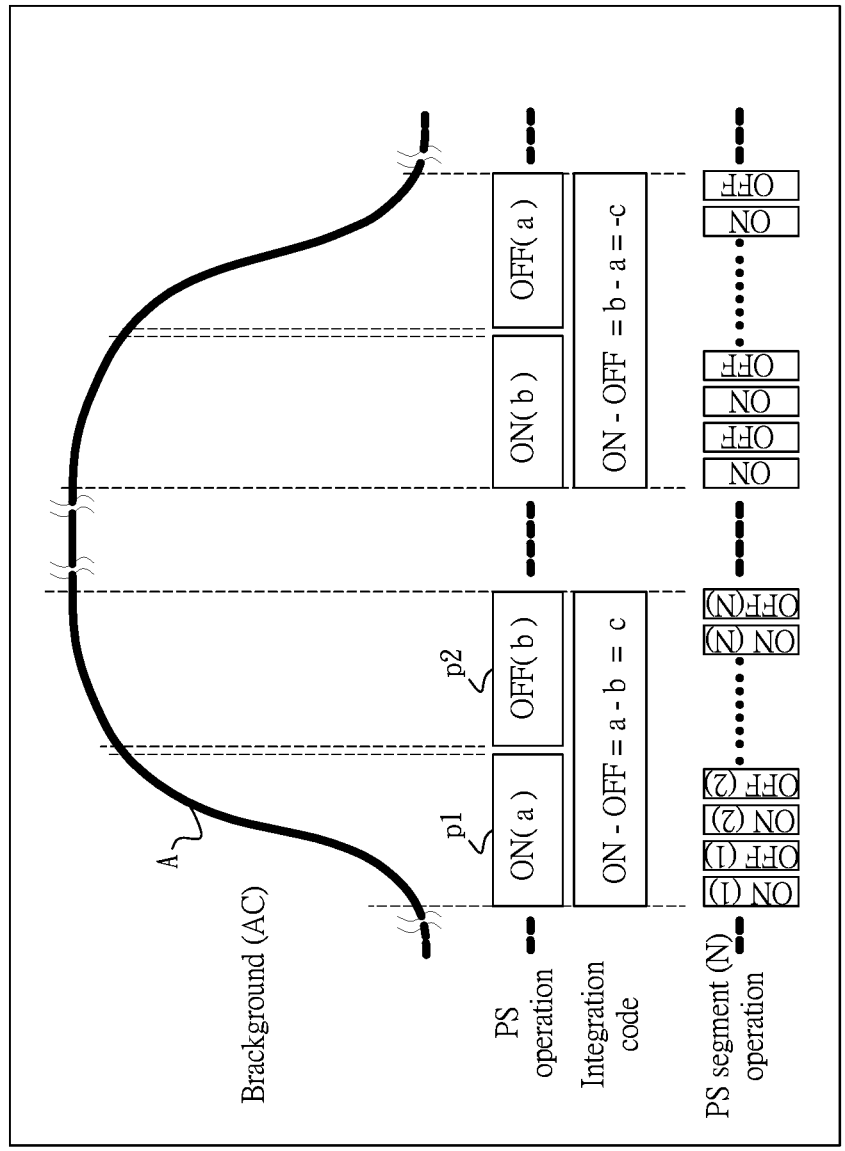
FIG. 2 shows a schematic diagram of the relation between the ambient light and the turn-on/turn-off operations of the light source according to the prior art.

According to the above embodiment, please refer to FIG. 2. According to the prior art, when the luminance of the ambient light A is increased in risen slope, the ambient-light component in the integration for each light-source turn-on operation ON(i) is smaller than the ambient-light component in the integration for the light-source turn-off operation OFF(i). Contrarily, according to the present embodiment, the ambient-light component in the integration for the first light-source turn-on operation ON(1) is also smaller than the ambient-light component in the integration for the first light-source turn-off operation OFF(1). Nonetheless, the ambient-light component in the integration for the second light-source turn-on operation ON(2) is greater than the ambient-light component in the integration for the second light-source turn-off operation OFF(2). Thereby, for the group G1, when the processing circuit 107 subtracts the sum of the integrations for the first light-source turn-off operation OFF(1) and the second light-source turn-off operation OFF(2) from the sum of the integrations for the first light-source turn-on operation ON(1) and the second light-source turn-on operation ON(2), the ambient-light component may be reduced effectively.

Likewise, when the ambient light A is decreased in failing slope, the ambient-light component in the integration for the first light-source turn-on operation ON(1) is greater than the ambient-light component in the integration for the first light-source turn-off operation OFF(1). Nonetheless, the ambient-light component in the integration for the second light-source turn-on operation ON(2) is smaller than the ambient-light component in the integration for the second light-source turn-off operation OFF(2). Thereby, for the group G1, the ambient-light components in the two sets of light-source turn-on operations and light-source turn-off operations may cancel out and hence reducing the ambient-light component effectively.

Please note that according to the present embodiment, it is not required to further increase the operating frequency for shortening the operation period of light-source turn-on and turn-off according to the prior art. In other words. if the time for each light-source turn-on operation or each light-source turn-off operation is 12.5 µs according to the prior art, then in the present embodiment, the time for the first light-source turn-on operation ON(1), the first light-source turn-off operation OFF(1), the second light-source turn-on operation ON(2), or the second light-source turn-off operation OFF(2) still may be controlled to be 12.5 µs. Under such circumstances, according to the embodiment of the present application, by swapping the operation period for light-source turning on and turning off, the ambient-light component in the sensing result may be reduced.

Please continue to refer to FIG. 4. According to the present embodiment, more light-source turn-on operations and light-source turn-off operations may be improved as described above. For example, another group G2 followed after the group GI also includes two sets of light-source turn-on operations ON(3). ON(4) and light-source turn-off operations OFF(3), OFF(4). Likewise, the order of the fourth light-source turn-on operation ON(3) and the fourth light-source turn-off operation OFF(4) is swapped and formed as the order of the third light-source turn-on operation ON(3), the third light-source turn-off operation OFF(3), the fourth light-source turn-off operation OFF(4), and the fourth light-source turn-on operation ON(4). Thereby, in addition to the third light-source turn-off operation OFF(3) and the fourth light-source turn-off operation OFF(4) in the group G2, the second light-source turn-on operation ON(2) and the third light-source turn-on operation ON(3) between the two groups G1, G2 are also performed successively.

By using the operation method according to the above embodiment of the present application. the ambient-light component in the sensing result is further reduced without changing the light-source turn-on and turn-off operations according to the prior art. Assume that the noise is approximately ±200 units by subtracting the sum of the integrations for all light-source turn-off operations OFF(i) from the sum of the integrations for all light-source turn-on operations ON(i) according to the prior art. By using the improved technology according to the embodiment of the present application, since the ambient-light components in the two sets of light-source turn-on and light-source turn-off operations may be cancelled out, the noise value of the ambient light in the sensing result may be controlled below ±50 units. Thereby, even if the proximity sensor 100 is disposed below the panel, the proximity sensor 100 still maintains excellent accuracy.

In the following description, various embodiments of the present application are described using figures for describing the present application in detail. Nonetheless, the concepts of the present application may be implemented in various forms. Those embodiments are not used to limit the scope and range of the present application.

Figure 5:
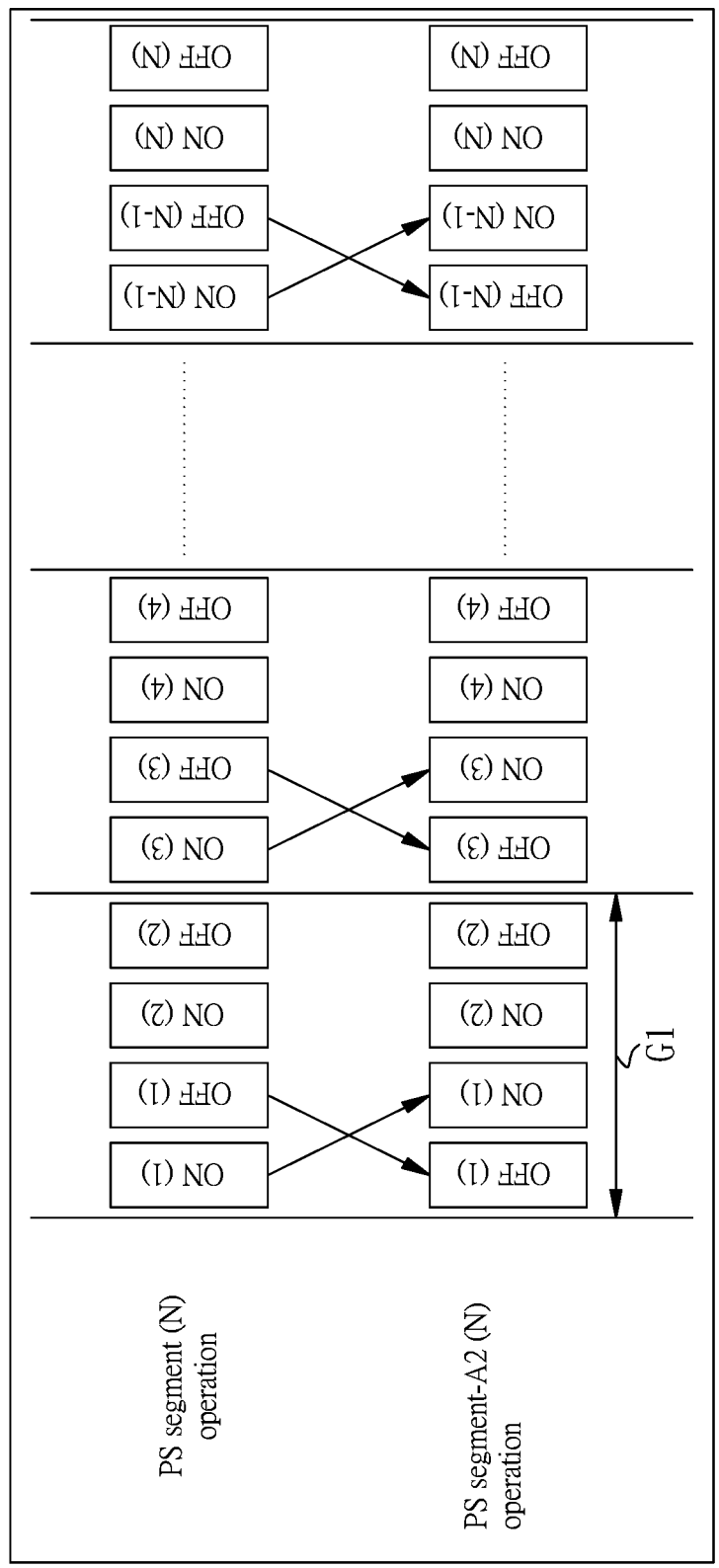
FIG. 5 shows a timing diagram of the turn-on/turn-off operations of the light source according to a second embodiment of the present application.

Please refer to FIG. 5. According to the previous embodiment, the processing circuit 107 swapped the order of the second light-source turn-on operation ON(2) and the second light-source turn-off operation OFF(2) in the group G1 to form the order of the first light-source turn-on operation ON(1), the first light-source turn-off operation OFF(1), the second light source turn-off operation OFF(2), and the second light-source turn-on operation ON(2). According to another embodiment of the present application, the order of the first light-source turn-on operation ON(1) and the first light-source turn-off operation OFF(2) in the group G1 may be swapped to form the order of the first light-source turn-off operation OFF(1), the first light-source turn-on operation ON(1), the second light-source turn-off operation OFF(2), and the second light-source turn-on operation ON(2). Thereby, the first light-source turn-on operation ON(1) and the second light-source turn-on operation ON(2) are performed successively, as shown in the bottom half of FIG. 5. Accordingly, according to the various embodiments of the present application, in the group G1, either the two light-source turn-on operations ON(1), ON(2) or the two light-source turn-off operations OFF(1), OFF(2) are performed successively.

A person skilled in the art may understand that N sets of light-source turn-on operations ON(1)~ON(N) and light-source turn-off operations OFF(1)~OFF(N) may be divided into a plurality of groups with each containing two sets of light-source turn-on and turn-off operations. Namely, at most N/2 groups may be divided. To elaborate, please refer to FIG. 2. According to the prior art, when the luminance of the ambient light A falls in a risen slope region, approximately one light-source turn-on operation p1 and one light-source turn-off operation p2 may be executed. If the time for each of the light-source turn-on operation p1 and the light-source turn-off operation is 400 µs, respectively, by shortening the light-source turn-on operation ON(i) or the light-source turn-off operation OFF(i) to 12.5 µs, 32 sets if light-source turn-on and turn-off operations ON(1)~ON(32), OFF(1)~OFF(32) may be performed in the risen slope region. If these light-source turn-on and turn-off operations are further divided into groups containing two sets of light-source turn-on and turn-off operations, 16 groups with each containing two sets of light-source turn-on and turn-off operations may be divided.

Figure 6:
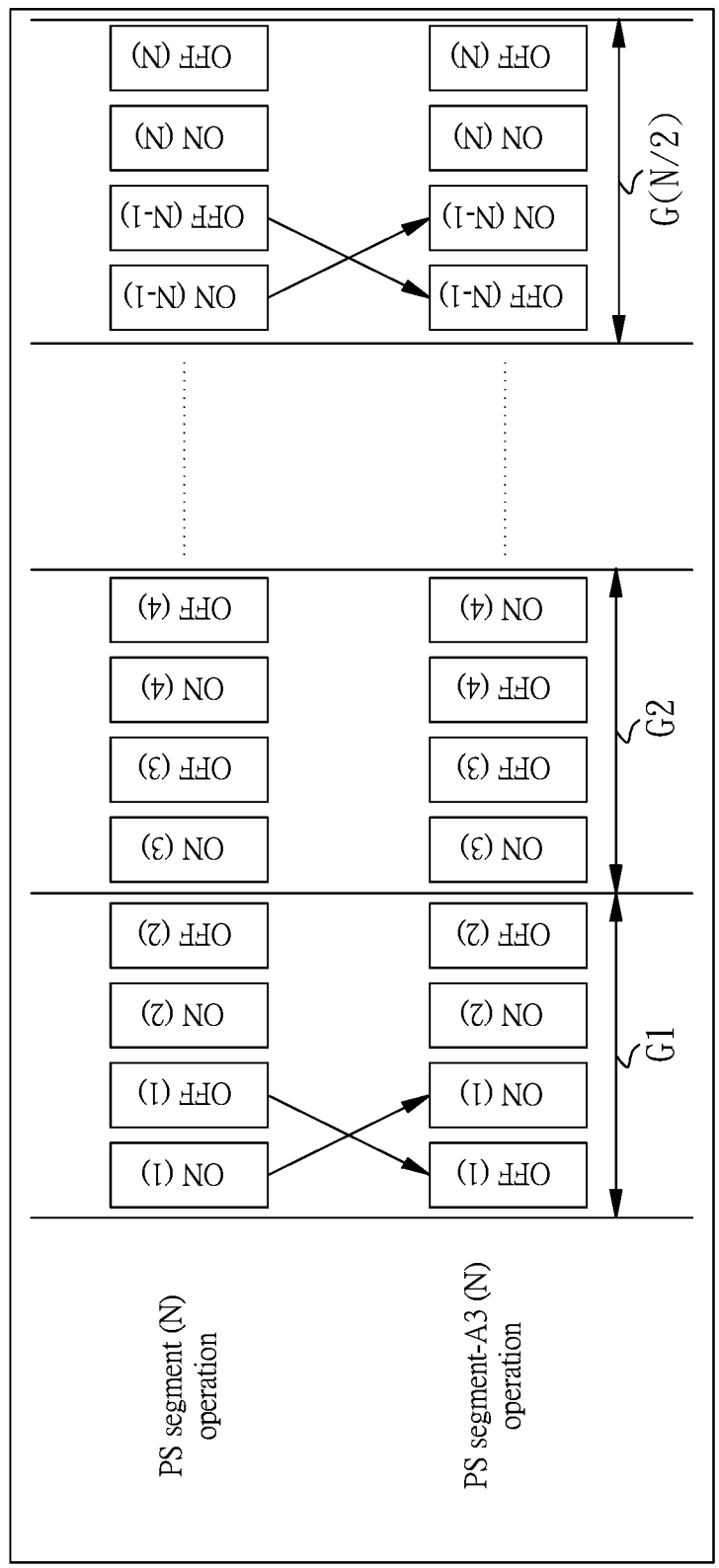
FIG. 6 shows a timing diagram of the turn-on/turn-off operations of the light source according to a third embodiment of the present application.

While the present application is applied as shown in FIGS. 4 and 5, the operation sequences in all groups may be adjusted to two light-source turn-on operations ON(1), ON(2) or two light-source turn-off operations OFF(1), OFF (2) performed successively. Alternatively, refer to FIG. 6, according to another embodiment of the present application, only a portion of the groups is adjusted. For example, a group GI is adjusted to the first light-source turn-on operation ON(1) and the second light-source turn-on operation ON(2) performed successively, while the other group G2 maintains the sequence of the first light-source turn-on operation ON(1), the second light-source turn-off operation OFF(1), the second light-source turn-on operation ON(2), and the second light-source turn-off operation OFF(2). In addition, another group G(N/2) may be adjusted to the first light-source turn-off operation OFF(1) and the second light-source turn-off operation OFF(2) performed successively. In practice, the proportion of the groups should be adjusted according to the improvement of each embodiment in the present application, which needs to depend on actual circuit requirements. For example, suppose only 20% of groups using the improvement according to the present application, the ambient-light noise in the sensing result may be effectively controlled below the target value. In that case, the rest of groups may maintain original operation sequence. Preferably, according to the embodiments of the present application, over 20%, 50%, or 80% of groups may adopt two light-source turn-on operations and two light-source turn-off operations performed successively.

Figure 7:
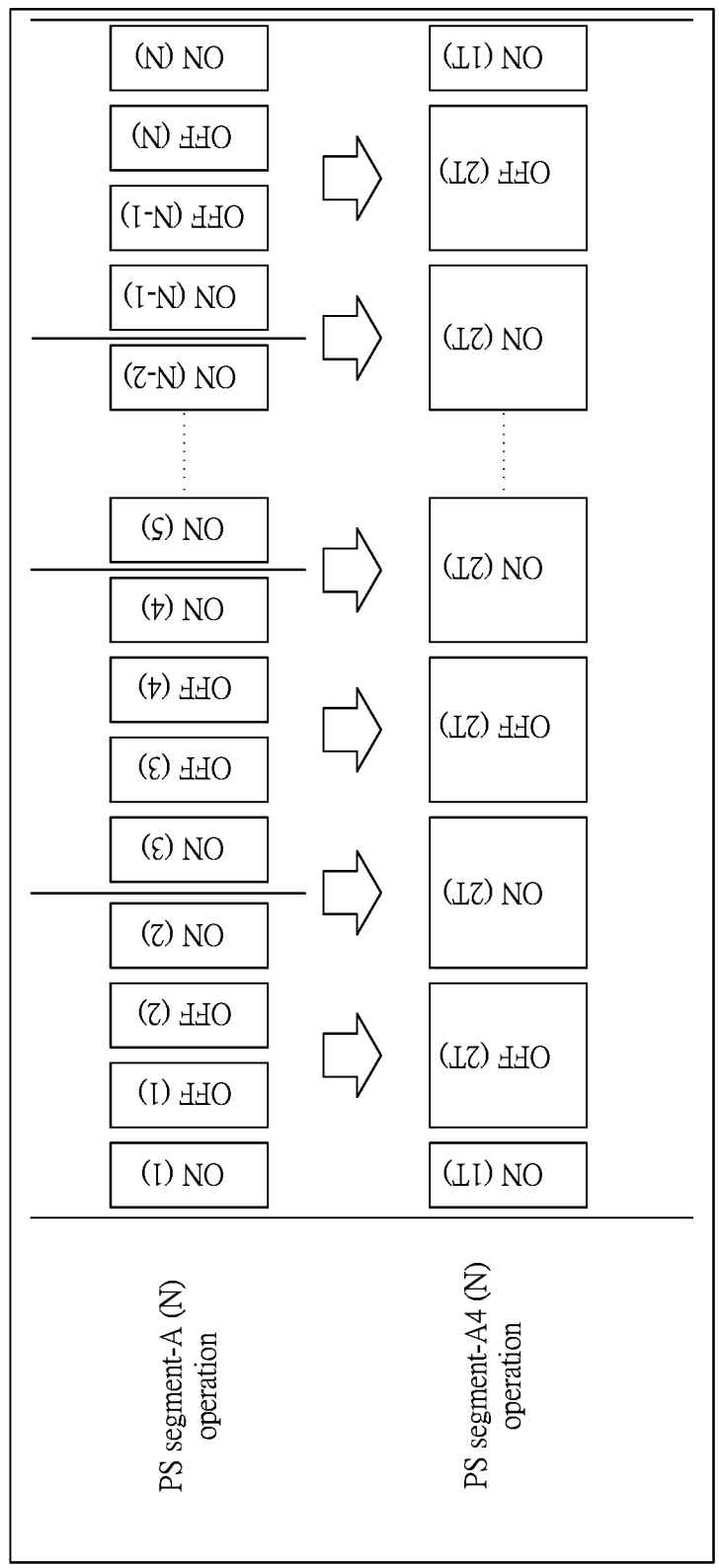
FIG. 7 shows a timing diagram of the turn-on/turn-off operations of the light source according to a fourth embodiment of the present application.

As shown in FIG. 7, in general, the processing circuit 107 will transmit a control signal to the light-emitting unit driving circuit 105 for controlling the light-emitting unit driving circuit 105 to provide driving current to a light-emitting unit 101. For example, when the control signal is high voltage level, the light-emitting unit driving circuit 105 will drive the light-emitting unit 101 to emit light L. Then, when each time the light-source turn-on operation ON(i) starts, the control signal should be high level. Nonetheless, according to the embodiment of the present application, two successive light-source turn-on operations might occur. Thereby, the processing circuit 107 may combine two consecutive light-source turn-on operations and continuously transmit high-level control signals to the light-emitting unit driving circuit 105 during the operation period of the two light-source turn-on operations. Hence, in FIG. 7, it is possible to have a normal operation time (for example, 12.5 µs) for the light-source turn-on operation ON(1T). Alternatively, it is also possible to exist double operation time (for example, 25 µs) for the light-source turn-on operation ON(2T). Likewise, two successive light-source turn-off operations might occur. Thereby, the processing circuit 107 may combine two consecutive light-source turn-off operations and continuously transmit control signals with identical voltage levels to the light-emitting unit driving circuit 105 during the operation period of the two light-source turn-off operations. Hence, it is possible to have a normal operation time (for example, 12.5 µs) for the light-source turn-off operation OFF(1T). Alternatively, it is also possible to exist double operation time (for example, 25 µs) for the light-source turn-off operation OFF(2T). By adjusting for two consecutive light-source turn-on operations or two consecutive light-source turn-off operations in the groups, the overall design difficulty for the processing circuit 107 or the proximity sensor 100 may be simplified.

To sum up, according to the control method of proximity sensor, the execution order for light-source turn-on operations and light-source turn-off operations may be adjusted. No matter when the luminance of the ambient light is increasing or decreasing, the ambient-light components in two sets of light-source turn-on and turn-off operation in a portion of groups may be cancelled out and achieving the technical effect of reducing the ambient-light component in the sensing result. Accordingly, the present application undoubtedly may improve the accuracy of proximity sensor.

The invention claimed is:

1. An operation method of proximity sensor, comprising steps of:
a processing circuit controlling a light-emitting device to emit light using a plurality sets of light-source turn-on operations and light-source turn-off operations;
an optical sensor receiving said light and outputting a sensing signal corresponding to the intensity of said light; and
said processing circuit operating said sensing signal for producing a sensing result;
wherein said plurality sets of light-source turn-on operations and light-source turn-off operations include a group; said group include two sets of light-source turn-on operations and light-source turn-off operations; and said two light-source turn-on operations in said group or said two light-source turn-off operations in said group are performed successively, wherein said processing circuit integrates and sums said sensing signal from said plurality of light-source turn-on operations and said plurality of light-source turn-off operations; and said processing circuit subtracts the integration for said plurality of light-source turn-off operations from the integration for said plurality of light-source turn-on operations to give said sensing result.

2. The operation method of proximity sensor of claim 1, wherein said group is followed by another group including two sets of light-source turn-on operations and light-source turn-off operations; and two light-source turn-on operations or two light-source turn-off operations between the two groups are also performed successively.

3. The operation method of proximity sensor of claim 1, wherein said two light-source turn-on operation in said group are performed successively;
and two light-source turn-off operations in another group are performed successively.

4. The operation method of proximity sensor of claim 1, wherein said plurality sets of light-source turn-on operations and light-source turn-off operations are divided into n groups with each group including two sets of light-source turn-on operations and light-source turn-off operations; and in over 20% of said n groups, said two light-source turn-on operations or said two light-source turn-off operations are performed successively.

5. The operation method of proximity sensor of claim 1, wherein said processing circuit transmits a control signal to a light-emitting unit driving circuit for controlling said light-emitting unit driving circuit to provide driving current to said light-emitting device and further drive said light-emitting device to emit light.

6. The operation method of proximity sensor of claim 5, wherein when two light-source turn-on operations are performed successively, said processing circuit combines said two light-source turn-on operations performed successively by transmitting control signals with identical voltage levels continuously in said two light-source turn-on operations to said light-emitting unit driving circuit.

7. The operation method of proximity sensor of claim 5, wherein when two light-source turn-off operations are performed successively, said processing circuit combines said two consecutive light-source turn-off operations by transmitting control signals with identical voltage levels continuously in said two light-source turn-off operations to said light-emitting unit driving circuit.

8. An operation method of proximity sensor, comprising steps of:
a processing circuit controlling a light-emitting device to emit light using a plurality sets of light-source turn-on operations and light-source turn-off operations;
an optical sensor receiving said light and outputting a sensing signal corresponding to the intensity of said light; and
said processing circuit operating said sensing signal for producing a sensing result;
wherein said plurality sets of light-source turn-on operations and light-source turn-off operations include a group; said group includes a first light-source turn-on operation, a first light-source turn-off operation, a second light-source turn-on operation, and a second light-source turn-off operation; said group is performed in the order of said first light-source turn-on operation, said first light-source turn-off operation, said second light-source turn-off operation, and said second light-source turn-on operation; and said first light-source turn-off operation and said second light-source turn-off operation are performed successively.

9. An operation method of proximity sensor, comprising steps of:
- a processing circuit controlling a light-emitting device to emit light using a plurality sets of light-source turn-on operations and light-source turn-off operations;
- an optical sensor receiving said light and outputting a sensing signal corresponding to the intensity of said light; and
- said processing circuit operating said sensing signal for producing a sensing result;
- wherein said plurality sets of light-source turn-on operations and light-source turn-off operations include a group; said group includes a first light-source turn-on operation, a first light-source turn-off operation, a second light-source turn-on operation, and a second light-source turn-off operation; said group is performed in the order of said first light-source turn-off operation, said first light-source turn-on operation, said second light-source turn-on operation, and said second light-source turn-off operation; and said first light-source turn-on operation and said second light-source turn-on operation are performed successively.

* * * * *